(12) United States Patent
Linderman

(10) Patent No.: US 10,098,261 B2
(45) Date of Patent: Oct. 9, 2018

(54) DOUBLE INSULATED HEAT SPREADER

(71) Applicant: Enphase Energy, Inc., Petaluma, CA (US)

(72) Inventor: Ryan Linderman, Oakland, CA (US)

(73) Assignee: Enphase Energy, Inc., Petaluma, CA (US)

( * ) Notice: Subject to any disclaimer, the term of this patent is extended or adjusted under 35 U.S.C. 154(b) by 0 days.

(21) Appl. No.: 15/280,567

(22) Filed: Sep. 29, 2016

(65) Prior Publication Data

US 2017/0020033 A1 Jan. 19, 2017

Related U.S. Application Data

(63) Continuation of application No. 14/591,355, filed on Jan. 7, 2015, now Pat. No. 9,480,185.

(Continued)

(51) Int. Cl.
H05K 7/20 (2006.01)
H05K 1/02 (2006.01)
(Continued)

(52) U.S. Cl.
CPC ....... H05K 7/20409 (2013.01); H01F 27/022 (2013.01); H01F 27/08 (2013.01); H01L 33/483 (2013.01); H01L 33/642 (2013.01); H02M 7/003 (2013.01); H02S 40/42 (2014.12); H05K 1/0203 (2013.01); H05K 1/0204 (2013.01); H05K 1/0206 (2013.01); H05K 1/181 (2013.01);
(Continued)

(58) Field of Classification Search
CPC .. H05K 5/064; H01F 27/022; H01F 2027/065
See application file for complete search history.

(56) References Cited

U.S. PATENT DOCUMENTS 5,679,457 A    10/1997   Bergerson
5,920,462 A     7/1999   Glovatsky et al.
(Continued)

FOREIGN PATENT DOCUMENTS

CN    201584403 U    9/2010
EP      1316998 A2   6/2003
(Continued)

OTHER PUBLICATIONS

Lohbeck, "Design for Dust", Test & Measurement World, pp. 47-52, Apr. 2008.

(Continued)

Primary Examiner — Robert J Hoffberg
(74) Attorney, Agent, or Firm — Moser Taboada

(57) ABSTRACT

An apparatus for thermal management for an electric device. In one embodiment the apparatus comprises a primary heat spreader disposed within an enclosure that contains a printed circuit board (PCB) populated with at least one electrical component, wherein the primary heat spreader is thermally conductive and wherein the interior of the enclosure is at least partially filled with an encapsulating material; a secondary heat spreader coupled to an exterior face of a first wall of the enclosure, wherein the secondary heat spreader is thermally conductive; and a thermal interface coupled between the primary head spreader and the PCB, wherein the thermal interface is thermally conductive and electrically insulating.

20 Claims, 3 Drawing Sheets

Related U.S. Application Data

(60) Provisional application No. 61/924,861, filed on Jan. 8, 2014.

(51) Int. Cl.
| | | |
|---|---|---|
| H01F 27/02 | (2006.01) | |
| H01F 27/08 | (2006.01) | |
| H02S 40/42 | (2014.01) | |
| H01L 33/48 | (2010.01) | |
| H01L 33/64 | (2010.01) | |
| H02M 7/00 | (2006.01) | |
| H05K 1/18 | (2006.01) | |
| H05K 5/06 | (2006.01) | |
| H01F 27/06 | (2006.01) | |

(52) U.S. Cl.
CPC ............ *H05K 7/205* (2013.01); *H05K 7/209* (2013.01); *H05K 7/2039* (2013.01); *H05K 7/20418* (2013.01); *H05K 7/20436* (2013.01); *H05K 7/20472* (2013.01); *H01F 2027/065* (2013.01); *H05K 1/0209* (2013.01); *H05K 5/064* (2013.01); *H05K 7/2049* (2013.01); *H05K 7/20463* (2013.01); *H05K 2201/066* (2013.01)

(56) References Cited

U.S. PATENT DOCUMENTS

| | | | |
|---|---|---|---|
| 5,923,084 A | 7/1999 | Inoue et al. | |
| 5,965,937 A | 10/1999 | Chiu et al. | |
| 5,991,155 A | 11/1999 | Kobayashi et al. | |
| 6,091,199 A | 7/2000 | Crouse et al. | |
| 6,111,322 A | 8/2000 | Ando et al. | |
| 6,448,509 B1 | 9/2002 | Huemoeller | |
| 6,570,086 B1 | 5/2003 | Shimoji et al. | |
| 6,696,643 B2 | 2/2004 | Takano | |
| 6,724,631 B2 | 4/2004 | Ye et al. | |
| 6,816,377 B2 | 11/2004 | Itabash | |
| 6,867,972 B2* | 3/2005 | Franke | H01L 23/433 174/252 |
| 6,936,855 B1 | 8/2005 | Harrah | |
| 7,031,165 B2 | 4/2006 | Itabashi et al. | |
| 7,239,519 B2 | 7/2007 | Guo et al. | |
| 7,242,585 B2 | 7/2007 | Fukuma et al. | |
| 7,258,808 B2 | 8/2007 | Kwon et al. | |
| 7,576,988 B2 | 8/2009 | Schwarz | |
| 7,586,189 B2 | 9/2009 | Yamauchi et al. | |
| 7,595,468 B2 | 9/2009 | Moon et al. | |
| 7,616,444 B2* | 11/2009 | Munch | H01L 23/40 165/104.33 |
| 7,646,093 B2* | 1/2010 | Braunisch | H01L 25/0657 257/686 |
| 7,663,883 B2 | 2/2010 | Shirakami et al. | |
| 8,059,425 B2 | 11/2011 | Huang et al. | |
| 8,363,407 B2 | 1/2013 | Yamamoto et al. | |
| 8,446,726 B2* | 5/2013 | Schloerke | H01L 25/072 165/80.3 |
| 8,698,258 B2* | 4/2014 | Nagarkar | B81B 3/0081 257/414 |
| 8,864,039 B2* | 10/2014 | Manzi | G06K 19/07749 235/492 |
| 9,137,928 B2 | 9/2015 | Chen et al. | |
| 9,480,185 B2* | 10/2016 | Linderman | H05K 1/0203 |
| 2004/0075986 A1 | 4/2004 | Schwarz | |
| 2006/0120054 A1 | 6/2006 | Buschke | |
| 2007/0211431 A1 | 9/2007 | Munch et al. | |
| 2008/0150125 A1 | 6/2008 | Braunisch et al. | |
| 2009/0091888 A1 | 4/2009 | Lin et al. | |
| 2009/0205696 A1 | 8/2009 | Koester et al. | |
| 2010/0008047 A1 | 1/2010 | Moon | |
| 2012/0147565 A1 | 6/2012 | I et al. | |
| 2013/0077257 A1 | 3/2013 | Tsai | |
| 2013/0082376 A1 | 4/2013 | Nagarkar et al. | |
| 2015/0179611 A1* | 6/2015 | Lu | H05K 5/0247 257/659 |
| 2015/0181766 A1* | 6/2015 | Lu | H05K 5/0247 361/715 |
| 2016/0192493 A1* | 6/2016 | Ehrmann | H05K 3/3452 361/709 |

FOREIGN PATENT DOCUMENTS

| | | |
|---|---|---|
| EP | 1333494 A2 | 8/2003 |
| WO | WO-9907197 A1 | 2/1999 |

OTHER PUBLICATIONS

Fraivillig, "Solid-Metal Thermal Columns in Conventional PCBs", Fraivillig Technologies, pp. 5, Nov. 17, 2013.
International Search Report and Written Opinion dated Apr. 24, 2015 for PCT Application No. PCT/US2015/010443.

* cited by examiner

DOUBLE INSULATED HEAT SPREADER

CROSS-REFERENCE TO RELATED APPLICATION

This application is a continuation of co-pending U.S. patent application Ser. No. 14/591,355 filed Jan. 7, 2015, which claims priority to U.S. Provisional Patent Application No. 61/924,861 filed on Jan. 8, 2014. Each of the aforementioned patent applications is herein incorporated in its entirety by reference.

BACKGROUND OF THE INVENTION

Field of the Invention

Embodiments of the present disclosure relate generally to dissipating heat generated by a high-voltage electronics device, and more particularly, to a double insulated heat spreader for dissipating heat generated by a high-voltage electronics device.

Description of the Related Art

Thermal management is an important design consideration for high voltage electronic devices that give off heat during operation, such as power converters, high intensity LED light fixtures, and high voltage photovoltaic modules. Thermal management techniques must be used to efficiently dissipate the heat generated during operation of various high voltage electronic power devices.

Therefore, there is a need in the art for an apparatus for efficient thermal management for electronic devices.

SUMMARY OF THE INVENTION

Embodiments of the present invention generally relate to an apparatus for thermal management of electronic devices substantially as shown in and/or described in connection with at least one of the figures, as set forth more completely in the claims.

These and other features and advantages of the present disclosure may be appreciated from a review of the following detailed description of the present disclosure, along with the accompanying figures in which like reference numerals refer to like parts throughout.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
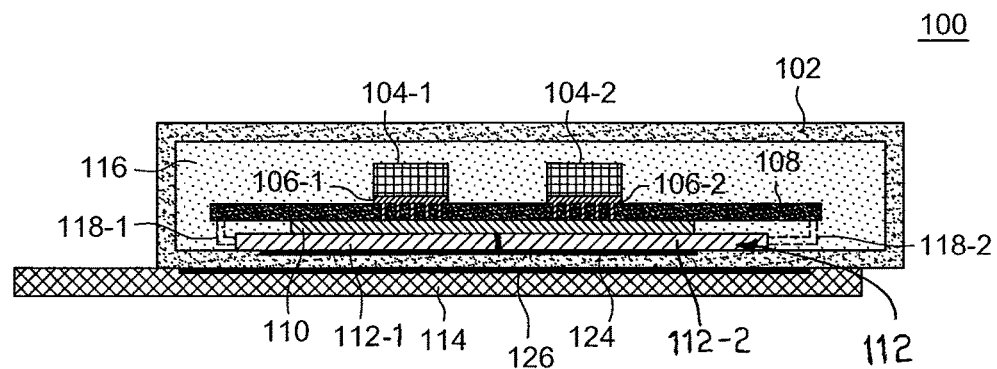
FIG. 1 is a cross-sectional view of an equipment box assembly in accordance with one or more embodiments of the present invention.

FIG. 1 is a cross-sectional view of an equipment box assembly 100 in accordance with one or more embodiments of the present invention. The equipment box assembly 100 is an electronic device and comprises an enclosure 102 having disposed therein a printed circuit board (PCB) 108 populated with a plurality of high heat density electronic components 104-1 and 104-2. Although two electronic components are shown, in other embodiments fewer or more electronic components (as well as any other necessary components) may be mounted on the PCB 108. The enclosure 102 is a suitably sized and shaped enclosure for encasing the PCB 108 and is formed from an insulating material, such as a rigid plastic (e.g., Polycarbonate, high-density polyethylene (HDPE), polyethylene ether (PPE), and blends of these compounds with glass and other fillers), and provides a supplemental insulation layer.

Thermal vias 106-1 and 106-2 extend from the electronic components 104-1 and 104-2, respectively, through the PCB 108 to the underside of the PCB 108 for carrying heat away from the electronic components 104-1 and 104-2. A primary heat spreader 112 is disposed within the enclosure 102 along one of its inner walls; the primary heat spreader 112 may be formed from high thermal conductivity materials such as aluminum and copper or graphite composites A thermal interface 110 is coupled between the primary heat spreader 112 and the underside of the PCB 108 for coupling the primary heat spreader 112 to the components 104-1 and 104-2; the thermal interface 110 is a thermally conductive and electrically insulating interface material such as an adhesive or thermal pad (e.g., silicone or epoxy matrix filled with metal oxide or ceramic or glass particles. The thermal interface 110 may be coupled to both the PCB 108 and the primary heat spreader 112 by an adhesive, such as a thermal adhesive. In some embodiments, the primary heat spreader 112 is mechanically coupled to the periphery or interior regions of the PCB 108 by insulating (e.g., polymer) mechanical snap-on fasteners 118-1 and 118-2 (shown in phantom) for holding the PCB/thermal interface/primary heat spreader assembly in place while the adhesive cures.

An encapsulating material 116 such as polymer potting or conformal coating is disposed within the enclosure 102 or applied directly to the PCB 108 such that its interior is at least partially filled by the material 116 (in some embodiments the interior may be fully filled). The encapsulating material 116 may be any suitable material, such as polyurethane, polyimide, epoxy, silicone, and the like, for protecting the electronic components 104-1 and 104-2 from contact with potentially damaging elements, such as air, moisture, salt, acid, and the like. The encapsulating material 116 may be moisture curing such that it hardens after exposure to air, or it may be hardened by light, heat, or another suitable hardening means to form the encapsulated equipment box assembly 100. The encapsulating material 116 may also be first applied to the PCB 108 in an initial manufacturing step with the enclosure 102 formed by a secondary over-molding or injection molding step.

A secondary heat spreader 114 is coupled along an outside (i.e., exterior) face of the enclosure 102 to remove heat from other regions of the PCB 108 not addressed by the primary heat spreader 112. In some embodiments, such as the embodiment depicted in FIG. 1, the secondary heat spreader 114 is coupled on the exterior of the same wall of the enclosure 102 on which the primary heat spreader 112 is coupled. The secondary heat spreader 114 may be formed from thermally conductive materials such as copper, aluminum, or graphite filled composites. The secondary heat spreader 114 can be joined to the assembly at the same time the enclosure 102 is molded or pre-assembled with the enclosure 102. Alternatively the secondary heat spreader 114 can be attached to the enclosure 102 as a final step in the assembly process or prior to installing the equipment box 100 in its intended application.

The enclosure 102 safely encloses the live parts (i.e., the electronic components 104) of the PCB 108 such that there is a re-enforced or double insulation recognized rating. The enclosure 102 does not require the secondary heat spreader 114 to safely enclose the live parts of the PCB 108. The primary heat spreader 112 spreads the heat generated inside the equipment box assembly 100 to dissipate it through the enclosure 102; the secondary heat spreader 114 spreads the heat from the outer surface of the enclosure 102 to yet a larger area where it is exchanged with the ambient air surrounding the equipment box assembly 100. As is common in manufacturing joining or bonding processes, a thin adhesive or gap filling layer (i.e., interface layer 124) may exist between the primary heat spreader 112 and the interior surface of the enclosure 102. Similarly, a thin adhesive or gap filling interface material (i.e., interface layer 126) may also be present between the secondary heat spreader 114 and the outer surface of the enclosure 102. Additionally the enclosure 102 may have molded-in alignment pins that fixture the primary heat spreader 112 and the secondary heat spreader 114 in place during assembly.

In accordance with one or more embodiments of the present invention, the primary heat spreader 112 and the secondary heat spreader 114 are integrated with the PCB 108 and the enclosure 102, and are insulated from live parts by a plurality of separate insulation layers (e.g., the thermal interface 110, the encapsulating material 116, and the enclosure 102). Embodiments of the present invention provide for a double layer of electrical insulation for exposed metallic heat spreaders and an increased robustness towards moisture ingress. A basic insulation layer is defined by the thermal interface 110 and an initial encapsulation step employing the encapsulating material 116 (e.g., potting the enclosure 102 with potting material or applying conformal coating to the PCB 108 in an earlier manufacturing step) while a supplemental insulation is defined by a separate insulation layer between the primary heat spreader 112 and the secondary heat spreader 114 (e.g., the enclosure 102). Moisture ingress robustness is increased by intentionally not co-locating the insulating fasteners 118-1 and 118-2 between the basic and supplemental insulation layers (i.e., between the thermal interface 110/encapsulating material 116 and the enclosure 102) which prevents any defects in the encapsulation process from being co-located.

In one or more embodiments where the enclosure 102 is formed from a polymer, the use of a polymeric enclosure allows the equipment box assembly 100 to not be grounded as long the product can qualify to a "double insulation" rating (Class II), thereby eliminating the need for a ground wire and its afferent cost (i.e., the use of a regular conductive enclosure for the enclosure 102 implies that it should be grounded to an equipment ground conductor (Class I product), adding cost to the product as this ground wire needs to be added to an AC cord that is coupled to the equipment box assembly 100 and additional contacts must be used in the AC cord).

The present invention also allows for improved thermal management and reduced stress on the PCB 108 compared with metal enclosures that must be bolted to the PCB 108 for grounding and have only a single insulation layer. The present invention further lowers the cost of producing the equipment box assembly 100 when compared to using metal enclosures due to more efficient use of materials (less metal) and a simplified manufacturing process (fewer steps and sub-assemblies, injection and over molding instead of using screw fasteners and threaded holes and adhesive seal bands).

In some embodiments, the equipment box assembly 100 may be a power converter (e.g., a DC-DC, DC-AC, AC-DC, or AC-AC power converter) coupled to a power source (e.g., a battery, a renewable energy source such as a photovoltaic (PV) module, wind farms, hydroelectric systems, or the like). In certain embodiments, the equipment box assembly 100 is a type of power converter employed in a system comprising a plurality of power converters coupled to power sources, such as a solar power system having a plurality of power converters coupled to a plurality of PV modules. In one or more particular embodiments, the equipment box assembly 100 is a DC-AC inverter and the primary heat spreader 112 comprises two portions (e.g., two aluminum pieces) that are galvanically isolated from one another; for example, a first portion 112-1 of the primary heat spreader 112 may be located on the primary side of a transformer of the inverter (i.e., the first portion 112-1 is coupled to a DC stage of the inverter) and a second portion 112-2 of the primary heat spreader 112 may be located on the secondary side of the transformer (i.e., the second portion 112-2 is coupled to an AC stage of the inverter). In such embodiments, the inverter is rated for a double insulation system.

In additional embodiments the equipment box assembly 100 may be an LED light fixture with an optical window on the upper surface.

Figure 2:
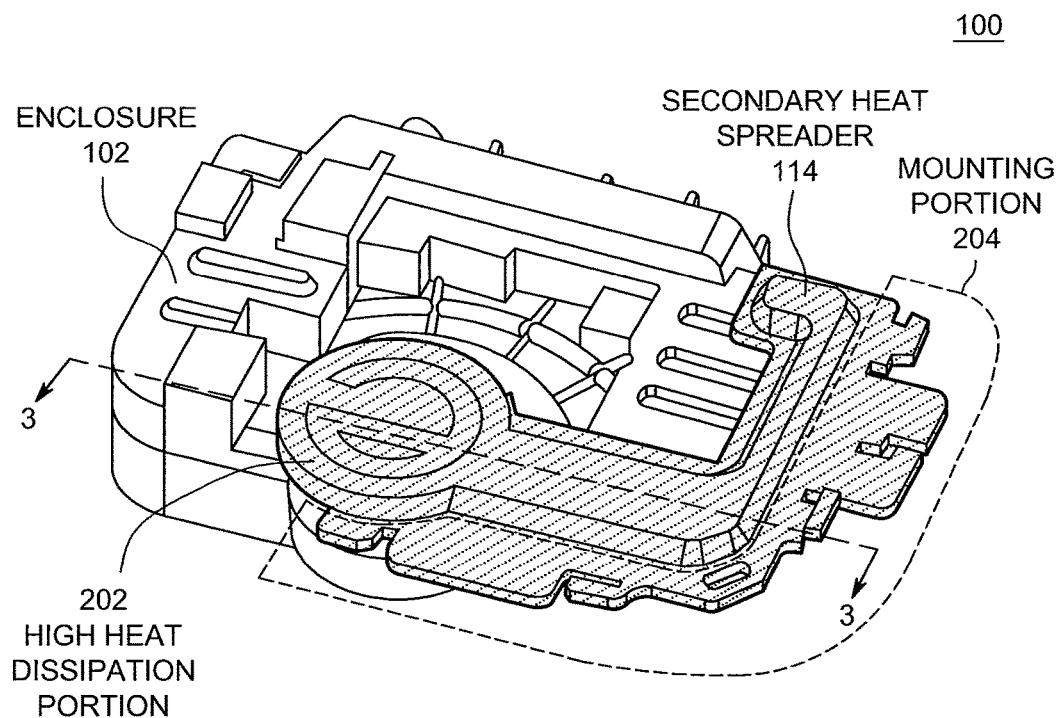
FIG. 2 is a top angled perspective view of an equipment box assembly in accordance with one or more alternative embodiments of the present invention.

FIG. 2 is a top angled perspective view of an equipment box assembly 100 in accordance with one or more alternative embodiments of the present invention. As depicted in FIG. 2, the secondary heat spreader 114 is substantially L-shaped (although alternatively it may have other shapes) and is affixed to the top exterior of the enclosure periphery, e.g., along the lower-right corner of the top of the enclosure 102. A high heat dissipation portion 202 of the secondary heat spreader 114 is sized such that it overlays a high-heat dissipating region that is within the enclosure 102. As depicted in FIG. 2, the high heat dissipation portion 202 is substantially circular and located on one end of the secondary heat spreader 114, although in other embodiments the high heat dissipation portion 202 may have a different shape and/or be located at a different area of the secondary heat spreader 114.

The secondary heat spreader 114 as depicted in FIG. 2 further comprises a mounting portion 204 along, for example, the corner/right hand edge of the secondary heat spreader 114. The mounting portion 204 comprises a plurality of mounting features (e.g., one or more faster slots, fastener holes, flanges, mechanical clips, and the like) for mechanically fixing the equipment box assembly 100 to a mechanical structure. For example, in some embodiments the equipment box assembly 100 may be a power converter that is mechanically mounted to a photovoltaic (PV) module via the mounting portion 204, where the power converter is further electrically coupled to the PV module for receiving the DC power from the PV module and generating a DC or an AC output power.

Figure 3:
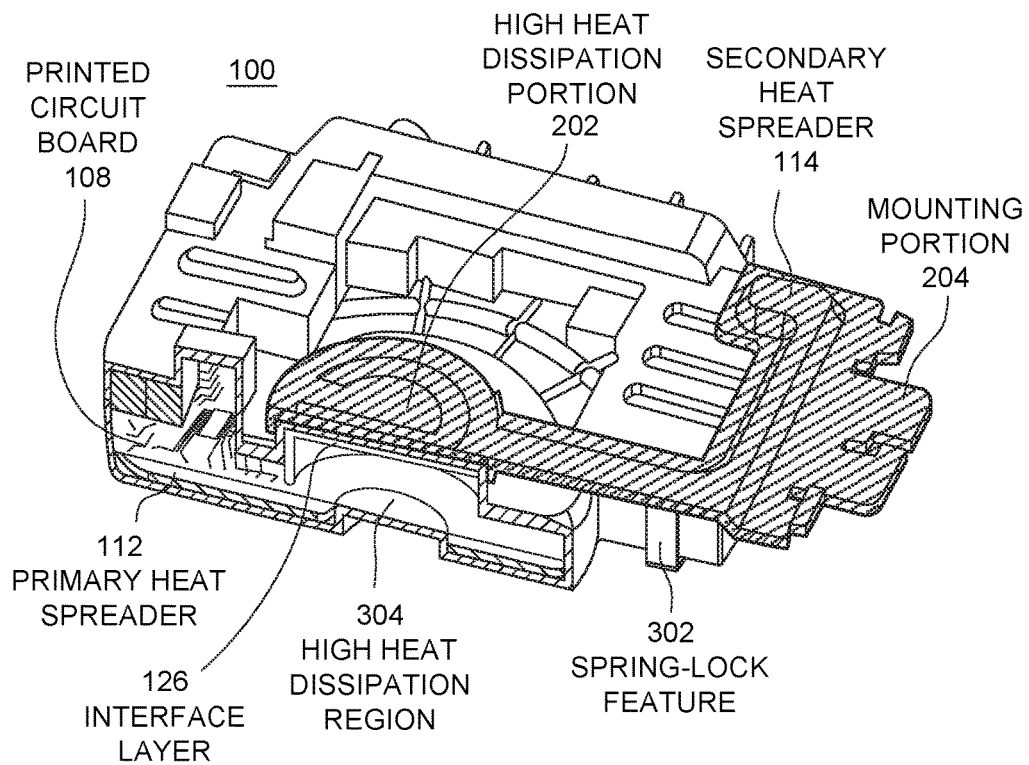
FIG. 3 is an angled perspective cross-sectional view of an equipment box assembly taken along line 3-3 of FIG. 2 in accordance with one or more embodiments of the present invention.

FIG. 3 is an angled perspective cross-sectional view of an equipment box assembly 100 taken along line 3-3 of FIG. 2 in accordance with one or more embodiments of the present invention. In the embodiment depicted, the primary heat spreader 112 is disposed between the PCB 108 and the enclosure 102 at the bottom of the equipment box assembly 100. The secondary heat spreader 114 is coupled to the exterior of the top of the enclosure 102 such that the high heat dissipation portion 202 is proximate to a high heat dissipation region 304 that is within the enclosure 102.

The secondary heat spreader 114 additionally comprises a spring-lock feature 302 for mechanically coupling the secondary heat spreader 114 to the enclosure 102. In embodiments where the interface layer 126 is an adhesive, the spring-lock feature 302 may be used to hold the secondary heat spreader 114 in place while the adhesive cures.

Figure 4:
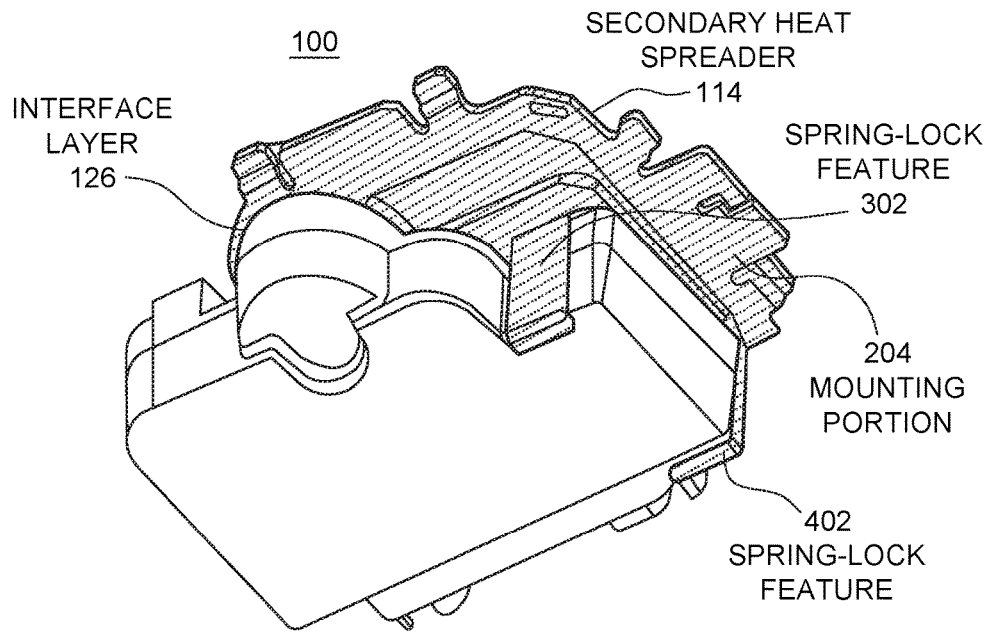
FIG. 4 is a bottom angled perspective view of an equipment box assembly in accordance with the embodiment depicted in FIG. 2.

FIG. 4 is a bottom angled perspective view of an equipment box assembly 100 in accordance with the embodiment depicted in FIG. 2. As shown in FIG. 4, the mounting portion 204 of the secondary heat spreader 114 extends beyond the sides of the enclosure 102. As can be seen in FIG. 4, the secondary heat spreader 114 comprises a second spring-lock feature 402 located on the opposing side of the secondary heat spreader 114 from the spring-lock feature 302. The spring-lock features 302 and 402 mechanically couple the secondary heat spreader 114 to the enclosure 102. In some embodiments, one or both of the spring-lock features 302 and 402 may be located at a different position on the secondary heat spreader 114. Although two spring-lock features 302 and 402 are depicted in FIG. 4, the number of, location, and type of such mechanical locking features may vary; for example, the secondary heat spreader 114 and/or the enclosure 102 may comprise additional mechanical fastening features, such as spring-lock clips, snap-fit clips, and the like, for mechanically coupling the secondary heat spreader 114 to the enclosure 102.

In some embodiments, the secondary heat spreader 114 may be attached to the enclosure 102 just prior to installing the equipment box assembly 100 in its intended application. For example, in some embodiments the equipment box assembly 100 is a power converter for use in a homeowner's solar power system and the secondary heat spreader 114 may be attached to the enclosure 102 (e.g., by applying a small amount of glue and snapping the parts in place) at the homeowner's location during installation of the solar power system. One advantage of distributing (e.g., shipping) the enclosure 102 without having the secondary heat spreader 114 yet attached is the added flexibility in how the equipment box assembly 100 may be used. For example, a secondary heat spreader 114 may have a differently-shaped mounting portion 204 if the equipment box assembly 100 is meant for a frame attach installation in a solar power system compared to a rail attach installation, or the enclosures 102 may be quickly routed to a different job and the mounting may be configured right before installation based on the required mounting portion 204.

Figure 5:
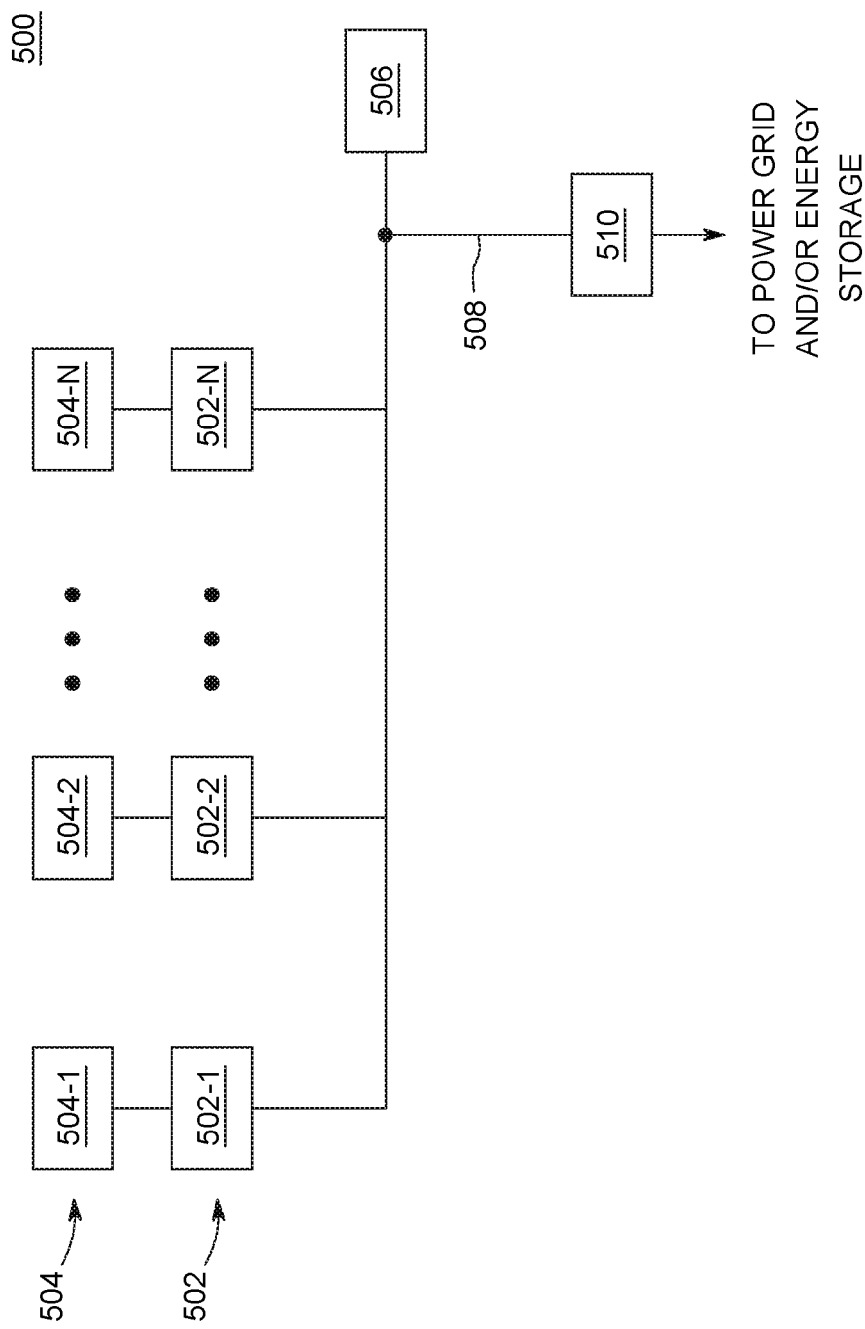
FIG. 5 is a block diagram of a system for power conversion using one or more embodiments of the present invention.

FIG. 5 is a block diagram of a system 500 for power conversion using one or more embodiments of the present invention. This diagram only portrays one variation of the myriad of possible system configurations and devices that may utilize the present invention. The present invention can be utilized in any system or device that utilizes an electronic device that gives off heat during operation, such as a power converter (i.e., a DC-DC converter, a DC-AC converter, an AC-DC converter, or an AC-AC converter), high intensity LED light fixtures, and the like.

The system 500 comprises a plurality of power converters 202-1, 202-2 . . . 202-N, collectively referred to as power converters 202; a plurality of DC power sources 504-1, 504-2 . . . 504-N, collectively referred to as DC power sources 504; a controller 506; a bus 508; and a load center 510. Each of the power converters 502 is an embodiment of the equipment box assembly 100.

The DC power sources 504 may be any suitable DC source, such as an output from a previous power conversion stage, a battery, a renewable energy source (e.g., a solar panel or photovoltaic (PV) module, a wind turbine, a hydro-electric system, or similar renewable energy source), or the like, for providing DC power.

Each power converter 502-1, 502-2 . . . 502-N is coupled to a DC power source 504-1, 504-2 . . . 504-N, respectively, in a one-to-one correspondence, although in some alternative embodiments multiple DC power sources 504 may be coupled to a single power converter 502. The power converters 502 are coupled to the controller 506 via the bus 508. The controller 506 is capable of communicating with the power converters 502 by wireless and/or wired communication (e.g., power line communication) for, for example, providing operative control of the power converters 502, collecting data from the power converters 502, and the like. The power converters 502 are further coupled to the load center 510 via the bus 508.

The power converters 502 convert the DC power from the DC power sources 504 to an output power; in some embodiments the output power may be DC output power (i.e., the power converters 502 are DC-DC converters), while in other embodiments the output power may be AC output power (i.e., the power converters 502 are DC-AC converters). The power converters 502 couple the generated output power to the load center 510 via the bus 508. The generated power may then be distributed for use, for example to one or more appliances, and/or the generated energy may be stored for later use, for example using batteries, heated water, hydro pumping, $H_2O$-to-hydrogen conversion, or the like. In some embodiments, the power converters 502 convert the DC input power to AC power that is commercial power grid compliant and couple the AC power to the commercial power grid via the load center 510.

In accordance with one or more embodiments of the present invention, each of the power converters 502 comprises primary and secondary heat spreaders (the primary heat spreader 112 and the secondary heat spreader 114) as well as multiple layers of electrical insulation for insulating the heat spreaders (e.g., a thermal interface 110/encapsulating material 116 and the enclosure 102) for providing thermal management. In certain embodiments, the enclosure (i.e., the enclosure 102) of each of the power converters 502 is formed from a polymer in order for each power converter 502 to be qualified to a double insulation rating (Class II) and thereby eliminate the need for power converters 502 to be grounded. In one or more of such embodiments, each power converter 502 is a DC-AC inverter and its primary heat spreader (i.e., primary heat spreader 112) comprises two portions, such as two aluminum pieces, that are galvanically isolated from one another. For example, for each power converter 502, a first portion of the primary heat spreader is located on the primary side of a transformer of the power converter 502 (i.e., the first portion is coupled to a DC stage of the power converter 502) and a second portion of the primary heat spreader is located on the secondary side of the transformer (i.e., the second portion is coupled to an AC stage of the power converter 502).

In one or more embodiments, each of the power converters 502 is an embodiment of the equipment box assembly 100 depicted in FIGS. 2-4, and the power converters 502 are each mechanically mounted to the corresponding DC power source 504 by a mounting portion (i.e., the mounting portion 204) of the secondary heat spreader.

The foregoing description of embodiments of the invention comprises a number of elements, devices, circuits and/or assemblies that perform various functions as described. These elements, devices, circuits, and/or assemblies are exemplary implementations of means for performing their respectively described functions.

While the foregoing is directed to embodiments of the present invention, other and further embodiments of the invention may be devised without departing from the basic scope thereof, and the scope thereof is defined by the claims that follow.

The invention claimed is:

1. An apparatus for thermal management for an electric device, comprising:
   an enclosure formed from an electrically insulating material, wherein the enclosure contains a printed circuit board (PCB) populated with at least one electrical component;
   a primary heat spreader disposed within the enclosure, wherein the primary heat spreader is thermally conductive and is thermally coupled to the enclosure, and wherein the primary heat spreader comprises a first portion and a second portion that are galvanically isolated from one another; and
   a thermal interface coupled between the primary heat spreader and the PCB, wherein the thermal interface is thermally conductive and electrically insulating.

2. The apparatus of claim 1, wherein the primary heat spreader is disposed along an interior face of a first wall of the enclosure.

3. The apparatus of claim 2, further comprising a secondary heat spreader coupled to an exterior face of the first wall, wherein the secondary heat spreader is thermally conductive.

4. The apparatus of claim 1, wherein an interior of the enclosure is at least partially filled with an encapsulating material.

5. The apparatus of claim 1, wherein the thermal interface is thermally coupled to the at least one electrical component by a plurality of thermal vias extending from the at least one electrical component through the PCB to the thermal interface.

6. The apparatus of claim 1, wherein the thermal interface is coupled to each of the PCB and the primary heat spreader by a thermal adhesive.

7. The apparatus of claim 1, wherein the PCB is mechanically coupled to the primary heat spreader by at least one insulating mechanical fastener.

8. The apparatus of claim 1, wherein the enclosure is part of a LED light fixture.

9. A power conversion apparatus with thermal management, comprising:
   a power converter comprising: a power converter enclosure formed from an electrically insulating material, the power converter enclosure containing a printed circuit board (PCB) populated with at least one electrical component;
   a primary heat spreader comprising a first portion and a second portion that are galvanically isolated from one another, the primary heat spreader disposed within the power converter enclosure, wherein the primary heat spreader is thermally conductive and is thermally coupled to the power converter enclosure; and
   a thermal interface coupled between the primary head heat spreader and the PCB, wherein the thermal interface is thermally conductive and electrically insulating.

10. The power conversion apparatus of claim 9, wherein the primary heat spreader is disposed along an interior face of a first wall of the power converter enclosure.

11. The power conversion apparatus of claim 10, further comprising a secondary heat spreader coupled to an exterior face of the first wall, wherein the secondary heat spreader is thermally conductive.

12. The power conversion apparatus of claim 9, wherein an interior of the power converter enclosure is at least partially filled with an encapsulating material.

13. The power conversion apparatus of claim 9, wherein the electrically insulating material is a polymer.

14. The power conversion apparatus of claim 13, wherein the power converter has a double insulated rating.

15. The power conversion apparatus of claim 9, wherein the thermal interface is thermally coupled to the at least one electrical component by a plurality of thermal vias extending from the at least one electrical component through the PCB to the thermal interface.

16. The power conversion apparatus of claim 9, wherein the thermal interface is coupled to each of the PCB and the primary heat spreader by a thermal adhesive.

17. The power conversion apparatus of claim 9, wherein the PCB is mechanically coupled to the primary heat spreader by at least one insulating mechanical fastener.

18. The power conversion apparatus of claim 9, wherein the power converter is a DC-AC inverter, and wherein the first portion of the primary heat spreader is coupled to a DC stage of the DC-AC inverter and the second portion of the primary heat spreader is coupled to an AC stage of the DC-AC inverter.

19. The power conversion apparatus of claim 9, further comprising a renewable energy source coupled to the power converter for providing DC input power.

20. The power conversion apparatus of claim 19, wherein the renewable energy source is a photovoltaic (PV) module.

* * * * *